(12) United States Patent
Thurmer et al.

(10) Patent No.: US 9,761,689 B2
(45) Date of Patent: Sep. 12, 2017

(54) METHOD OF FORMING A SEMICONDUCTOR DEVICE AND ACCORDING SEMICONDUCTOR DEVICE

(71) Applicant: GLOBALFOUNDRIES Inc., Grand Cayman (KY)

(72) Inventors: Dominic Thurmer, Dresden (DE); Hans-Juergen Thees, Dresden (DE); Kai Frohberg, Niederau (DE); Peter Moll, Dresden (DE); Heike Scholz, Hirschfeld (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 37 days.

(21) Appl. No.: 14/484,770

(22) Filed: Sep. 12, 2014

(65) Prior Publication Data

US 2016/0079086 A1   Mar. 17, 2016

(51) Int. Cl.
| | |
|---|---|
| *H01L 21/302* | (2006.01) |
| *H01L 21/461* | (2006.01) |
| *H01L 29/66* | (2006.01) |
| *H01L 29/423* | (2006.01) |
| *H01L 21/311* | (2006.01) |
| *H01L 21/3115* | (2006.01) |
| *H01L 21/3213* | (2006.01) |

(52) U.S. Cl.
CPC .... *H01L 29/6653* (2013.01); *H01L 21/31105* (2013.01); *H01L 21/31111* (2013.01); *H01L 21/31155* (2013.01); *H01L 21/32132* (2013.01); *H01L 29/42376* (2013.01)

(58) Field of Classification Search
CPC .......... H01L 29/6653; H01L 21/32132; H01L 21/31111; H01L 21/31155; H01L 21/31105; H01L 29/42376; H01L 21/28052; H01L 21/28097; H01L 29/4933; H01L 29/4941; H01L 29/4975; H01L 29/665
See application file for complete search history.

(56) References Cited

U.S. PATENT DOCUMENTS

| | | | | |
|---|---|---|---|---|
| 2004/0048472 | A1* | 3/2004 | Wieczorek et al. | 438/689 |
| 2007/0085132 | A1* | 4/2007 | Sanada | H01L 27/115 257/315 |
| 2007/0173004 | A1* | 7/2007 | Hall | H01L 21/28114 438/197 |
| 2010/0244121 | A1* | 9/2010 | Loiko | B82Y 10/00 257/325 |

(Continued)

*Primary Examiner* — Julio J Maldonado
*Assistant Examiner* — Stanetta Isaac
(74) *Attorney, Agent, or Firm* — Amerson Law Firm, PLLC

(57) ABSTRACT

The present disclosure provides a method of forming a semiconductor device, including a shaping of a gate structure of the semiconductor device such that a spacer removal after silicide formation is avoided and silicide overhang is suppressed. In some aspects of the present disclosure, a method of forming a semiconductor device is provided wherein a gate structure is provided over an active region of a semiconductor substrate, the gate structure including a gate electrode material and sidewall spacers. At least one of the gate electrode material and the sidewall spacers are shaped by applying a shaping process to the gate structure and a silicide portion is formed on the shaped gate structure.

18 Claims, 5 Drawing Sheets

(56) References Cited

U.S. PATENT DOCUMENTS

2011/0223732 A1* 9/2011 Griebenow ....... H01L 21/26513
438/275
2012/0326237 A1* 12/2012 Ponoth .............. H01L 21/76895
257/368
2014/0170827 A1* 6/2014 Zhang .......................... 438/305

* cited by examiner

METHOD OF FORMING A SEMICONDUCTOR DEVICE AND ACCORDING SEMICONDUCTOR DEVICE

BACKGROUND OF THE INVENTION

1. Field of the Invention

The present disclosure relates to a method of forming a semiconductor device and to a semiconductor device. Particularly, the present disclosure relates to processing at the end of front-end-of-line (FEOL) fabrication.

2. Description of the Related Art

In modern electronic equipment, integrated circuits (ICs) experience a vast applicability in a continuously spreading range of applications. Particularly, the demand for increasing mobility of electronic devices at high performance and low energy consumption drives developments to more and more compact devices having features with sizes ranging even into the deep submicron regime; the more so as current semiconductor technologies are apt of producing structures with dimensions in the magnitude of 10 nm. With ICs representing a set of electronic circuit elements integrated on a semiconductor material, normally silicon, ICs can be made much smaller than discreet circuits composed of independent circuit components. The majority of present-day ICs are implemented by using a plurality of circuit elements, such as field effect transistors (FETs), also called metal oxide semiconductor field effect transistors (MOSFETs or simply MOS transistors), and passive elements, such as resistors and capacitors, integrated on a semiconductor substrate with a given surface area. Typically, present day integrated circuits involve millions of single circuit elements formed on a semiconductor substrate.

The basic function of a MOSFET is that of an electronic switching element, wherein a current through a channel region between two contact regions, referred to as source and drain, is controlled by a gate electrode to which a voltage relative to source and drain is applied. Particularly, in applying a voltage exceeding a characteristic voltage level to the gate electrode, the conductivity state of a MOSFET is changed and the characteristic voltage level, usually called "threshold voltage" and in the following referred to as Vt, characterizes the switching behavior of a MOSFET. In general, Vt depends nontrivially on the transistor's properties, e.g., materials, dimensions etc., such that the implementation of a desired Vt involves plural steps of adjustment and fine-tuning during the fabrication process.

Currently, the most common digital integrated circuits built today use CMOS logic, which is fast and offers a high circuit density and low power per gate. CMOS or "complementary symmetry metal oxide semiconductor," as it is sometimes referred to, makes use of complementary and symmetrical pairs of P-type and N-type MOSFETs for implementing logic functions. Two important characteristics of CMOS devices are the high noise immunity and low static power consumption of a CMOS device because the series combination of complementary MOSFETs in a CMOS device draws significant power only momentarily during switching between ON- and OFF-states, since one transistor of a CMOS device is always in the OFF-state. Consequently, CMOS devices do not produce as much waste heat as other forms of logic, for example, transistor-transistor logic (TTL) or NMOS logic, which normally have some standing current even when not changing state.

With regard to FIGS. 1a and 1b, conventional FEOL processing after silicide formation is shown. FIG. 1a schematically illustrates in a cross-sectional view two gate structures 120 and 140 formed on a semiconductor substrate 100, conventionally a silicide substrate. In alignment with the gate structures 120, 140, source/drain regions 112, 114 and 116 are formed within the semiconductor substrate 100. Within the respective source/drain regions 112, 114 and 116, silicide regions 113, 115 and 117 are formed.

The gate structures 120 and 140 comprise respective gate dielectrics 124 and 144, respective gate electrode material layers 126 and 146, and respective sidewall spacers 128 and 148. The sidewall spacers 128 and 148 cover sidewalls of the respective gate electrode material layers 126 and 146. A respective one of silicide contacts 164 and 168 is formed during a preceding silicidation process on each of the gate electrode material layers 126 and 146.

Next, as illustrated in FIG. 1a, an etch process 170 is conventionally performed for removing the sidewall spacers 128, 148. As illustrated in FIG. 1b, the application of the etch process 170 removes the spacers 128, 148 after the silicide formation and before middle end-of-line processing, i.e., ILD layer deposition. Although the application of the process 170 increases a space between the two neighboring gate structures 120 and 140, the application of the process 170 results in a loss of active silicon and silicide material, as indicated in FIG. 1b by the broken lines S1, S2 and S3. Herein, each of the broken lines S1, S2 and S3 indicates a surface level of respective source/drain regions 112, 114, 116 and respective silicide regions 113, 115, 117 prior to the application of the process 170. The silicon recess and the corresponding silicide loss caused by process 170 poses the risk of causing ILD pinching during subsequent ILD-related process steps, such as TPEN deposition.

In spite of the effort to increase the space by removal of the sidewall spacers 128 and 148, the distance between the neighboring gate structures 120, 140, and particularly between the neighboring silicide regions 164 and 168, is decreased by a so-called "silicide overhang" 165 in case of silicide region 164 and a "silicide overhang" 169 in case of silicide region 168. Herein, a silicide overhang denotes that portion of a silicide region that extends beyond the sidewalls of the corresponding gate electrode material layer. Each of the silicide overhangs 165, 169 effectively lowers a minimum distance between the two neighboring gate structures 120, 140 by the amount of overhang, as indicated by reference numeral a. The minimum distance is denoted in FIG. 1b by reference numeral b. It is easy to see from FIG. 1b that the reduced distance b decreases the process margin for contact to gate shorts relating to contacts (not illustrated) contacting the respective ones of the silicide regions 113, 115 and 117.

In consequence, upon increasing the integration density of semiconductor devices on the semiconductor substrate 100, space between two neighboring gate structures 120 and 140 is reduced, leading to various problems, such as an unacceptably reduced process margin for contact to gate shorts and an increased parasitic capacitance between contacts and gate electrodes. Further issues arise with regard to the deposition of subsequent ILD layers, such as difficulties in depositing ILD layers without potential voids in the ILD layer due to the reduced distance b and resulting tungsten vias deteriorating device performance. Furthermore, due to the aggressive etch chemistry of the process 170 in FIG. 1a, a high silicon/silicide loss is created, causing further suboptimal profiles for subsequent ILD layers, such that the problem of potential voids is increased rather than decreased.

In view of the above problems of the state in the art, it is, therefore, desirable to provide a method of forming a semiconductor device that overcomes the above-described drawbacks, as well as to provide a semiconductor device which does not suffer from the above flaws.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides a method of forming a semiconductor device, including a shaping of a gate structure of the semiconductor device such that a spacer removal after silicide formation is avoided and silicide overhang is suppressed.

In a first aspect of the present disclosure, a method of forming a semiconductor device is provided. In some illustrative embodiments herein, the method includes providing a gate structure over an active region of a semiconductor substrate, the gate structure comprising a gate electrode material and sidewall spacers, applying a shaping process to the gate structure for shaping at least one of the gate electrode material and the sidewall spacers, and forming a silicide portion on the shaped gate structure.

In a second aspect of the present disclosure, a method of forming a semiconductor device is provided. In some illustrative embodiments, the method includes providing a gate structure over an active region of a semiconductor substrate, the gate structure comprising a gate electrode material and sidewall spacers, applying a first shaping process to the sidewall spacers for shaping the sidewall spacers after the formation of source/drain regions within the active region, and forming a silicide portion on the shaped gate structure.

In some illustrative embodiments herein, a second shaping process is performed after the first shaping process for substantially selectively removing the gate electrode material relative to the shaped sidewall spacers at the upper surface such that the upper surface of the gate electrode material and an upper surface of the sidewall spacers is substantially level.

In a third aspect of the present disclosure, a semiconductor device is provided. In some illustrative embodiments herein, the semiconductor device includes a gate structure with sidewall spacers and a gate electrode material, source/drain regions aligned to the gate structure, and a silicide contact formed on the gate structure. Herein, the sidewalls of the gate electrode material are only partially covered by the sidewall spacers.

In a fourth aspect of the present disclosure, a semiconductor device is provided. In some illustrative embodiments herein, the semiconductor device includes a gate structure with sidewall spacers and a gate electrode material, source/drain regions aligned to the gate structure, and a silicide region formed on the gate structure, wherein an overhang of the silicide region is substantially smaller than 1/6 of a separation between the source/drain regions by the gate electrode material.

BRIEF DESCRIPTION OF THE DRAWINGS

The disclosure may be understood by reference to the following description taken in conjunction with the accompanying drawings, in which like reference numerals identify like elements, and in which.

Figure 1A:
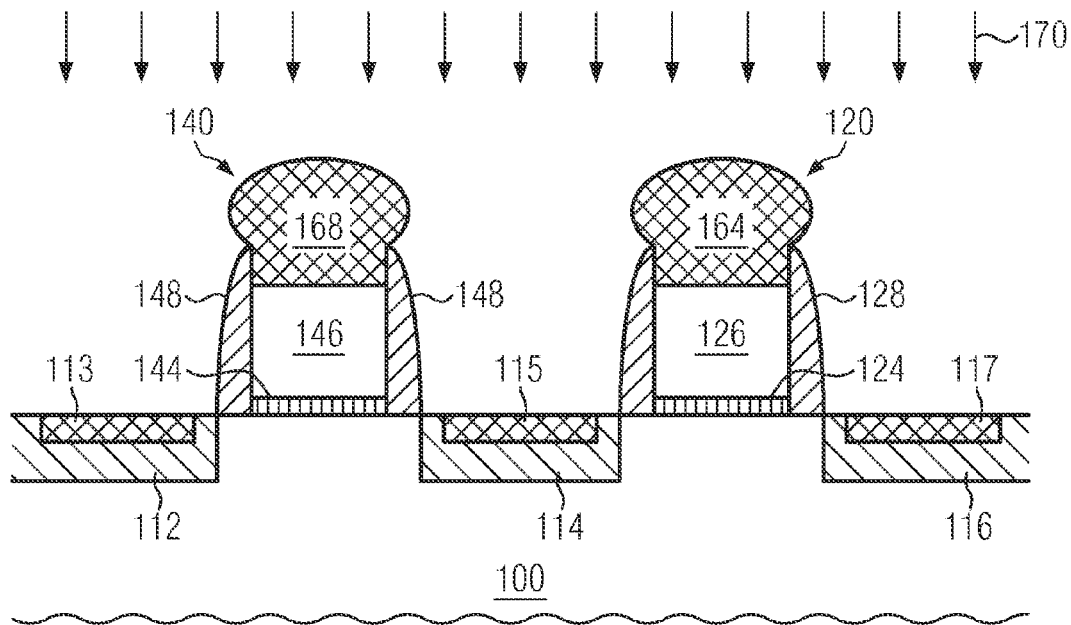
FIGS. 1a and 1b schematically show a conventional process flow.
Figure 1B:
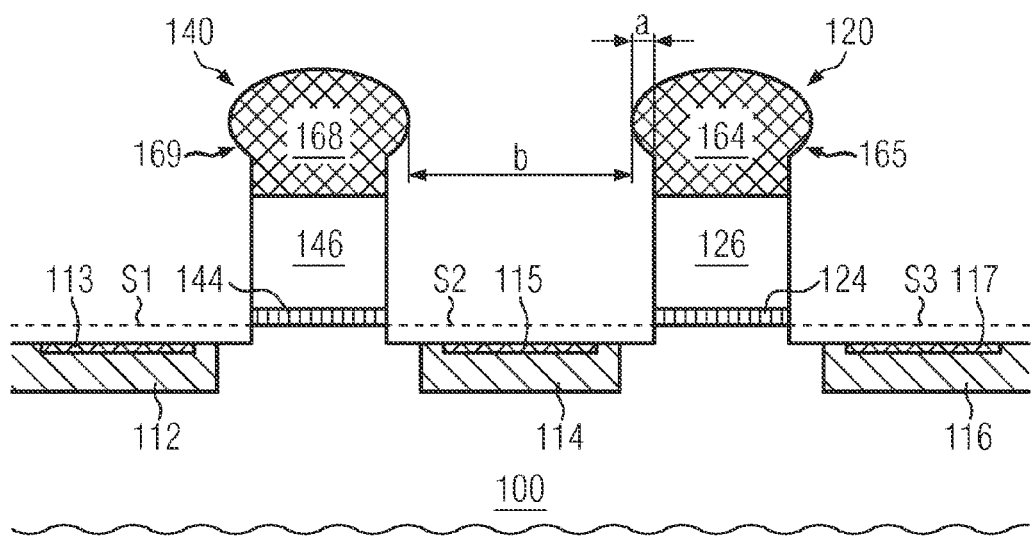

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example smaller than 50 nm or smaller than 35 nm. The person skilled in the art will appreciate that the present disclosure suggests semiconductor circuit elements having structures with minimal length and/or width dimensions smaller than 100 nm, for example smaller than 50 nm or smaller than 35 nm.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

Figure 2A:
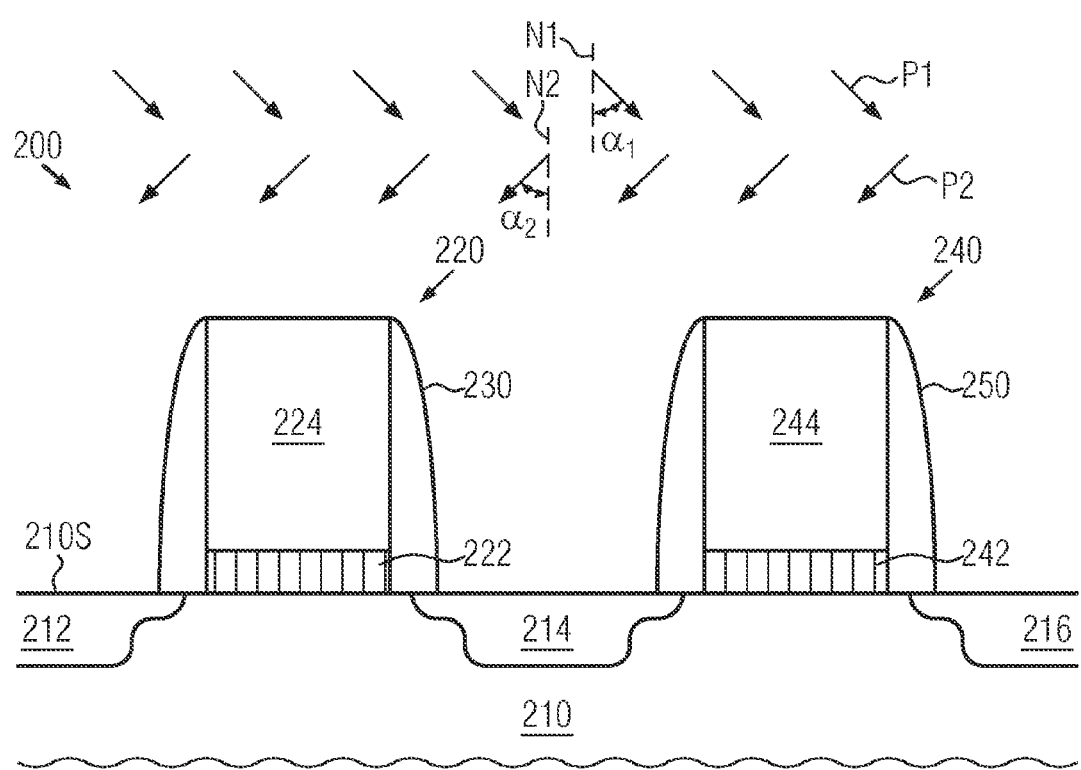
FIGS. 2a-2e schematically show a process in accordance with some illustrative embodiments of the present disclosure.

With regard to FIGS. 2a-2e, some illustrative embodiments of the present disclosure will be described. FIG. 2a schematically illustrates a semiconductor device structure 200 having two semiconductor devices, each of which comprising a respective one of the gate structures 220 and 240. The semiconductor device structure 200 is provided on and in a semiconductor substrate 210 which comprises a semiconductor material such as silicon, germanium, silicon/germanium, silicon/carbon, silicon/germanium/carbon, gallium arsenide, indium arsenide, indium phosphate and other appropriate semiconductor materials or a combination thereof. In preferred embodiments, the semiconductor material may be silicon. The person skilled in the art will appreciate that the semiconductor substrate 210 may be a single crystalline silicon layer having a surface orientation, i.e., a crystallographic orientation of the surface normal of a top surface 210S of the semiconductor substrate 210 being one of a major crystallographic orientation. The semiconductor substrate 210 may be a bulk substrate, a semiconductor-on-insulator (SOI) substrate or a hybrid substrate. The semiconductor substrate 210 may have a built-in stress, which does not pose any limitation to the present disclosure. The semiconductor substrate 210 may be doped, such as having one or more well regions incorporated therein, or alternatively may be undoped, at least at the stage shown in FIG. 2a.

The gate structure 220 is formed on the surface 210S of the semiconductor substrate 210. The gate structure 240 is formed over the surface 210S of the semiconductor substrate 210 adjacent to the gate structure 220. This does not pose any limitation to the present disclosure and the person skilled in the art will appreciate that one or more insulating structures, for example shallow trench isolation (STI), or one or more additional semiconductor devices are formed between the gate structures 220 and 240.

The gate structure 220 as shown in FIG. 2a comprises a gate stack configuration formed by a gate dielectric layer 222 disposed over the surface 210S of the semiconductor substrate 210 and a gate electrode material layer 224 disposed over the gate dielectric layer 222. Although not explicitly illustrated, a work function adjusting material may be formed between the gate dielectric layer 222 and the gate electrode material layer 224. Sidewalls of the gate stack configuration represented by the gate dielectric layer 222 and the gate electrode material layer 224 are covered by a sidewall spacer 230.

In some illustrative embodiments of the present disclosure, the gate dielectric layer 222 comprises one or more high-k dielectric materials, such as hafnium oxide, hafnium oxynitride and the like. Although not explicitly illustrated in FIG. 2a, the person skilled in the art will appreciate that a base layer (not illustrated) of silicon oxide may be present between the semiconductor substrate 210 and the gate dielectric layer 222, i.e., the base layer (not illustrated) may be formed on the surface 210S of the semiconductor substrate 210, at least on the surface portion covered by the gate structure 220. It is further possible that the semiconductor substrate 210 has a silicon/germanium channel formed close to the surface 210S of the semiconductor substrate 210 in case that a PMOS device is to be implemented with regard to the gate structure 220.

The gate structure 240 comprises a gate stack configuration formed similarly to the gate stack configuration of the gate structure 220. The gate structure 240, therefore, comprises a gate dielectric layer 242 disposed over the surface 210S of the semiconductor substrate 210 and a gate electrode material layer 244 disposed over the gate dielectric layer 242. Furthermore, sidewall spacers 250 are formed adjacent to the gate stack represented by the gate dielectric layer 242 and the gate electrode material layer 244.

The gate structures 220 and 240 may be formed by conventional gate stack-forming methods such as, for example, depositing one or more gate dielectric material layer-forming materials on or over the semiconductor substrate 210, followed by further depositing a gate material on the deposited gate dielectric material layer-forming material. Subsequently, one or more gate stacks may be formed by applying conventional patterning techniques, such as forming a masking structure over the gate material and performing an etching process through the mask structure, followed by a cleaning process for removing the masking structure, leaving one or more gate stacks, such as the gate structures 220 and 240, wherein the sidewall spacers 230 and 250 may be subsequently formed in accordance with known processes. The gate structures 220 and 240 may be formed simultaneously or consecutively.

In some illustrative embodiments, an NMOS-type device may be implemented with regard to the gate structure 220 and a PMOS-type device may be implemented with regard to the gate structure 240. Alternatively, the gate structures 220 and 240 may be implemented by the same device type. The person skilled in the art will appreciate that the material composition of at least one of the layers 222, 242 and 224, 244 may be identical or different, depending on the intended application and design goals.

In alignment with the gate structures 220, 240, source/drain regions 212, 214 and 216 are formed in the semiconductor substrate 210. The source/drain regions 212, 214 and 216 may be formed by implanting appropriate dopants into the semiconductor substrate 210 in alignment with at least one of the gate structures 220 and 240 and possibly by additional masking patterns formed over the semiconductor device structure 200. Alternatively, at least one of the source/drain regions may be provided by forming a recess structure and depositing doped semiconductor material, possibly with a strain-inducing effect, into the recess structure.

Each of the sidewall spacers 230 and 250 may be formed by at least one of a layer of silicon nitride and a layer of silicon oxide deposited and patterned during earlier stages of fabrication.

Particularly, the sidewall spacers 230, 250 may be composed by one or more sidewall spacer substructures of at least one of silicon nitride and silicon oxide for defining source/drain extension regions and deep source/drain regions as schematically illustrated by the source/drain regions 212, 214, 216.

Next, as illustrated in FIG. 2a, an implantation sequence comprising implantation steps P1 and P2 is performed. The implantation sequence P1, P2 is performed at tilt angles with respect to a normal direction of the surface 210S, as indicated by broken lines N1 and N2 in FIG. 2a. In particular, the implantation step P1 is performed at a tilt angle $\alpha 1$ relative to the normal direction N1 and the implantation step P2 is applied at a tilt angle $\alpha 2$ relative to the normal direction N2. According to some illustrative examples herein, the angles $\alpha 1$ and $\alpha 2$ are selected such that the absolute value of the angle $\alpha 1$ is about equal to the absolute value of the angle $\alpha 2$. The angles $\alpha 1$ and $\alpha 2$ may, therefore, merely differ by a factor of $(-1)$. Alternatively, the factor may be in a range between $(-0.7)$ to $(-1.3)$. In accordance with other illustrative examples, a difference between absolute values of $\alpha 1$ and $\alpha 2$ may be substantially less than about 5 degrees. According to some other illustrative examples, the absolute value of at least one of the angles $\alpha 1$ and $\alpha 2$ may be greater than about 15 degrees and preferably greater than about 30 degrees.

In some illustrative embodiments of the present disclosure, implantation species used in the implantation sequence P1, P2 are provided by at least one of xenon, germanium, silicon, nitride, carbon and the like. The person skilled in the art will appreciate that an appropriate implantation species may be provided by comparatively heavy species as compared to silicon. Alternatively or additionally, a preferred implantation species may be selected in dependence on the etch rate of the implanted material as compared to material that is not exposed to the implantation sequence P1, P2.

Figure 2B:
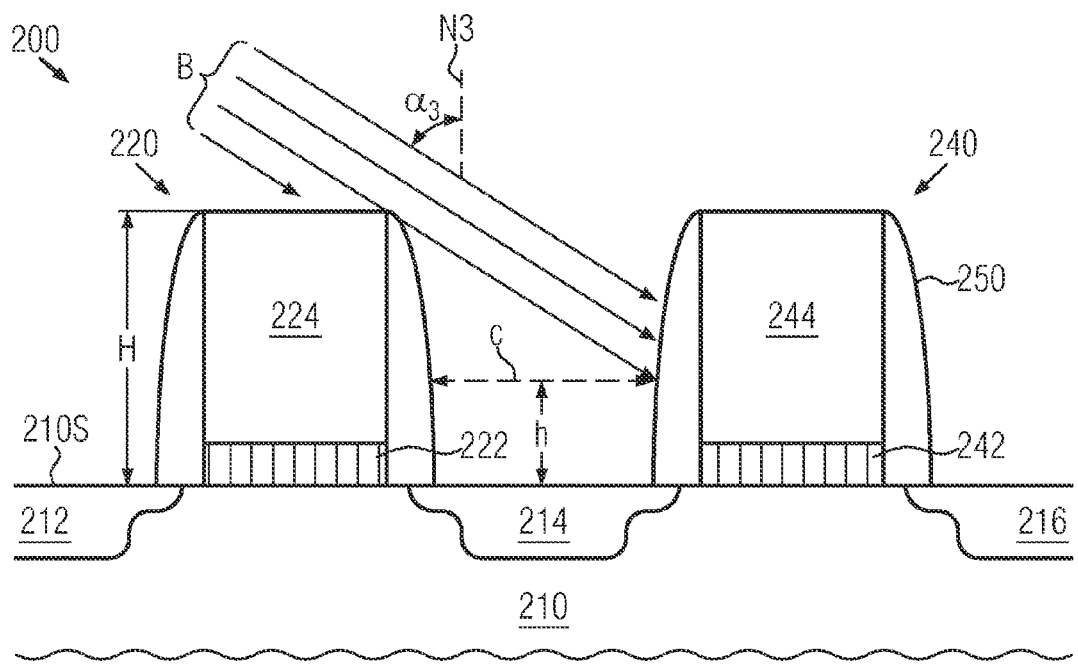

Referring to FIG. 2b, the semiconductor device structure 200 is schematically illustrated during the implantation sequence P1. Particularly, FIG. 2b illustrates a ray bundle B of implantation rays along which implanted species are implanted into the semiconductor device structure 200. The implantation rays of the ray bundle B are oriented relative to a normal direction N3 of the surface 210S, as indicated by means of angle $\alpha 3$. It is understood that $\alpha 3$ may substantially correspond to $\alpha 1$ in FIG. 2a.

An illustrative geometry of the semiconductor device structure 200 will be described with regard to FIG. 2b. A height of the gate structures 220, 240 is indicated by an extension H. Given preselected values for a separation between two neighboring gate structures 220, 240, indicated in FIG. 2b by broken arrow c, the height H and the angle $\alpha 3$, a "shadowing height h" may be determined by the following relation: $(H-h) \times (\tan \alpha 3) = c$. In other words, a lower portion of the sidewall spacer 250 of the gate structure 240 is shadowed by the gate structure 220. Particularly, portions of the sidewall spacer 250 extending upwardly away from the broken line c illustrated in FIG. 2b are exposed to the implantation step P1, as indicated in FIG. 2b by the ray bundle B, while portions of the sidewall spacer 250 lower than the broken line c extending down to the surface 210S of the semiconductor substrate 210 are substantially not exposed to the ray bundle B because the adjacent gate structure 220 shadows that lower portion of the sidewall spacer 250.

Figure 2C:
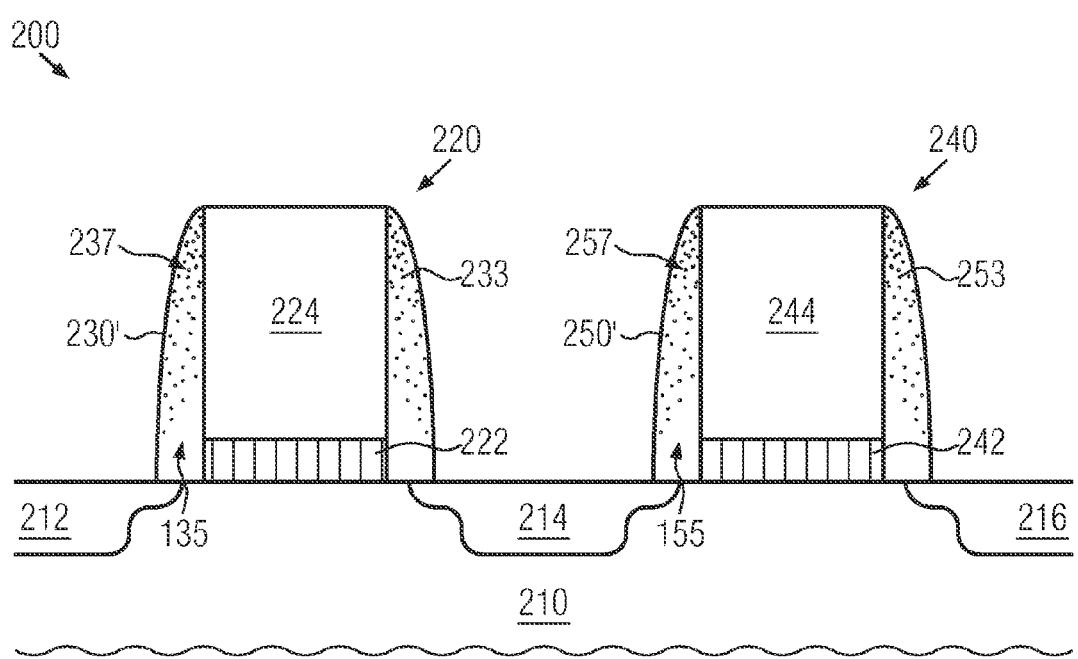

FIG. 2c schematically illustrates the semiconductor device structure 200 at a more advanced stage during fabrication, particularly after the implantation sequence P1, P2 is completed. As schematically illustrated, a sidewall spacer 230' having implantation species (indicated by dots 233 in FIG. 2c) incorporated therein, is provided. Due to shadowing as explained above with regard to FIG. 2b, in case of ray bundle B of the implantation step P1, lower portions 135 of the sidewall spacer 230' have substantially no implantation species incorporated therein. It is noted that, in some illustrative embodiments, the expression "substantially no implantation species" may be understood as having a density of implanted species smaller than 5% or preferably smaller than 1% or more preferably smaller than 0.5% of a maximum density of implanted species in the sidewall spacer 230'. Upper portions 237 disposed over the lower portion 135 have implantation species 233 incorporated therein.

Accordingly, in case of the sidewall spacer 250, after the implantation sequence P1, P2 is completed, a sidewall spacer 250' with implantation species incorporated therein (indicated by dots 253) is provided. For the above-outlined reasons, lower portions 155 of the sidewall spacer 250' having substantially no implantation species incorporated therein are present. The expression "substantially no implantation species" is to be understood in correspondence with the above explanations. Opposed to the lower portions 155, upper portions 257 disposed over the lower portion 155 have implantation species 253 incorporated therein.

Figure 2D:
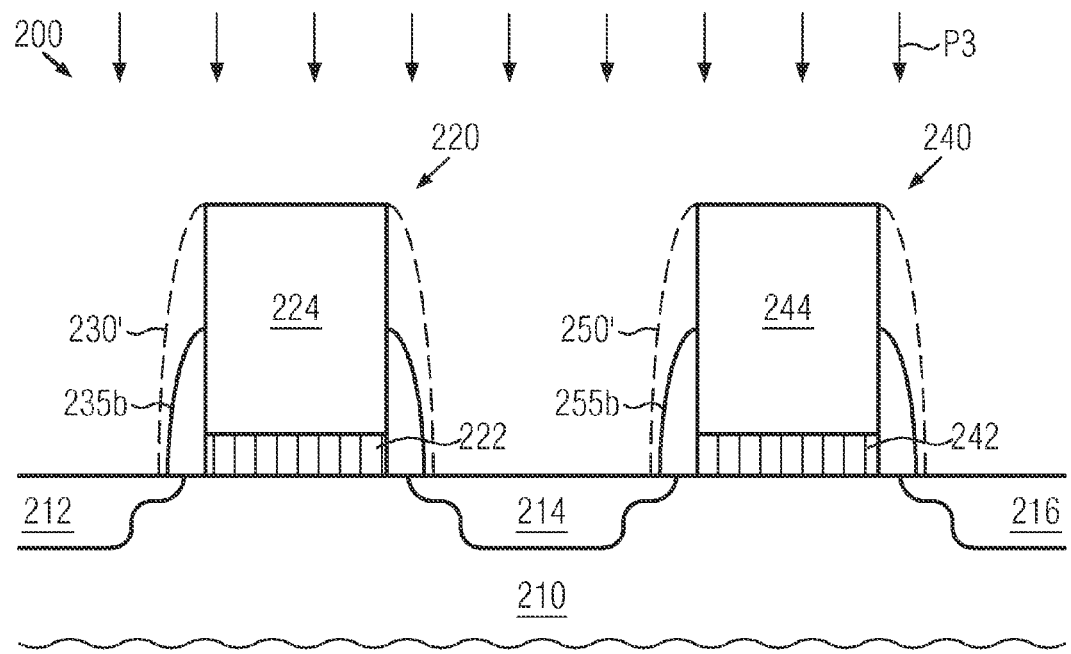

Referring to FIG. 2d, the semiconductor device structure 200 is illustrated at a more advanced stage during fabrication, particularly during application of an etching process P3. The etching process P3 is applied to the semiconductor device structure 200 as illustrated in FIG. 2c so as to form shaped sidewall spacers 235b and 255b, respectively, when exposing the sidewall spacers 230' and 250' to the etching process P3. According to a special illustrative example herein, the etching process P3 may be provided by an anisotropic etching process. The person skilled in the art will appreciate that the etching process P3 is implemented such that an etch selectivity between the upper portions 237 and 257 of the respective sidewall spacers 230' and 250' relative to lower portions 135 and 155 is used to substantially remove the upper portions 237 and 257 of the sidewall spacers 230' and 250'.

In an illustrative example, the etch rates can be modified for a hydro-oxide etch chemistry in case of silicon, for HF in case of oxide material, and for hot $H_3PO_4$ in case of nitride material, such as SiN. In a special illustrative example herein, HF may be provided by diluted HF (200:1). For example, a C implantation (6 keV, 1E16) may lead to an etch rate of SiN in hot $H_3PO_4$ (about 160° C.) of about 9 to 10 nanometers/minute, an N implantation (7 keV, 1E16) may lead to an etch rate of SiN in hot $H_3PO_4$ of about 14 nanometers/min, and implantation of Si (12 keV, 1E16) may result in an etch rate of about 15 nanometers/min, while undoped SiN has an etch rate of about 16 nanometers/min. On the other hand, an oxide etch rate (e.g. TEOS) in DHF (200:1) shows an etch rate (compared to an initial TEOS thickness) of 13%/min for an Si implantation of 12 keV and 1E15 (energy and dosage) during an initial time interval of about 100 seconds, while undoped $SiO_2$ has an etch rate of 10.2%/min. Increasing the dosage of Si leads to 8.03%/min (12 keV and 5E15) and 5.42%/min (12 keV and 1E16) during the initial time interval. After about 200 seconds, the etch rate of 13%/min decreases to 10.1%/min and the etch rate of 8.03%/min increases to 11.4%/min. The etch rates of undoped oxide and of highly-doped (1E16) oxide remain unchanged. Therefore, Si doping may suppress oxide etch rates in DHF solution and enhance nitride removal rates in hot $H_3PO_4$.

The person skilled in the art will appreciate that an appropriate implantation set-up may be selected in accordance with a desired etch selectivity for obtaining shaped sidewall spacers. In this way, for example, nearly triangular sidewall spacers may be achieved.

The person skilled in the art will appreciate that the sidewall shaping process P1, P2, P3 may be performed before or after an annealing step is applied for activating the source/drain dopants and healing damages caused by the implantations.

Figure 2E:
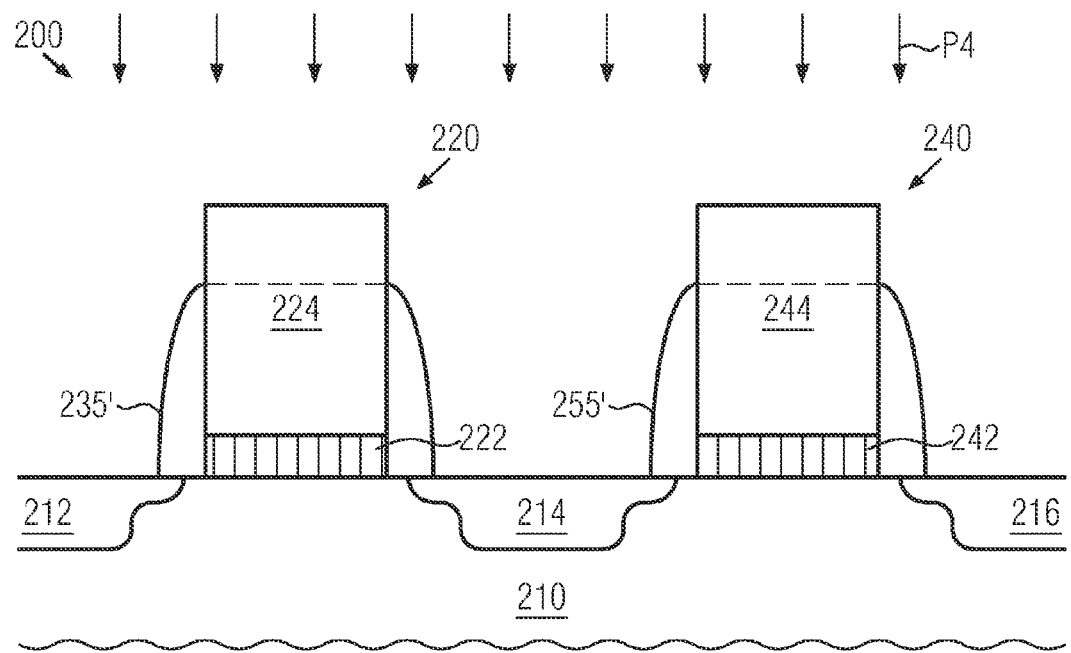

In accordance with some illustrative embodiments of the present disclosure, a further shaping process may be applied for shaping the gate electrode material layers 224, 244 prior to any silicidation process. The further shaping process comprises an etching step P4, e.g., a reactive ion etching (RIE) step, for shaping the gate electrode material layers 224, 244 such that any gate electrode material extending beyond and raising above a maximum height of the sidewall spacers 235', 255' is substantially removed. As illustrated in FIG. 2e, the etching process P4 achieves a trimming back of the gate electrode material layers 224, 244 such that an upper exposed surface of the gate electrode material layers that is exposed to the process P4 substantially levels with the sidewall spacers 235', 255' as indicated by broken lines in FIG. 2e. In this way, any silicide overhang is suppressed due to the application of the gate electrode material layer shaping process prior to silicidation.

Subsequent to the above-described processing, a conventional silicidation process (not illustrated) is performed by depositing a metal material over the semiconductor device structure 200 and applying an annealing step (not illustrated), followed by removal of metal material (not illustrated) that is not silicided.

Although the above-described illustrative embodiments show a sidewall spacer-shaping process to be performed before silicidation, this does not represent a limitation of the present disclosure. The person skilled in the art will appreciate that the sidewall spacer-shaping process (P1, P2, P3 above) may be omitted such that only a shaping process for shaping gate electrode material (P4 above) is applied for ensuring that the gate electrode material is appropriately shaped such that no silicide overhang will be created during the subsequent silicidation.

Figure 3A:
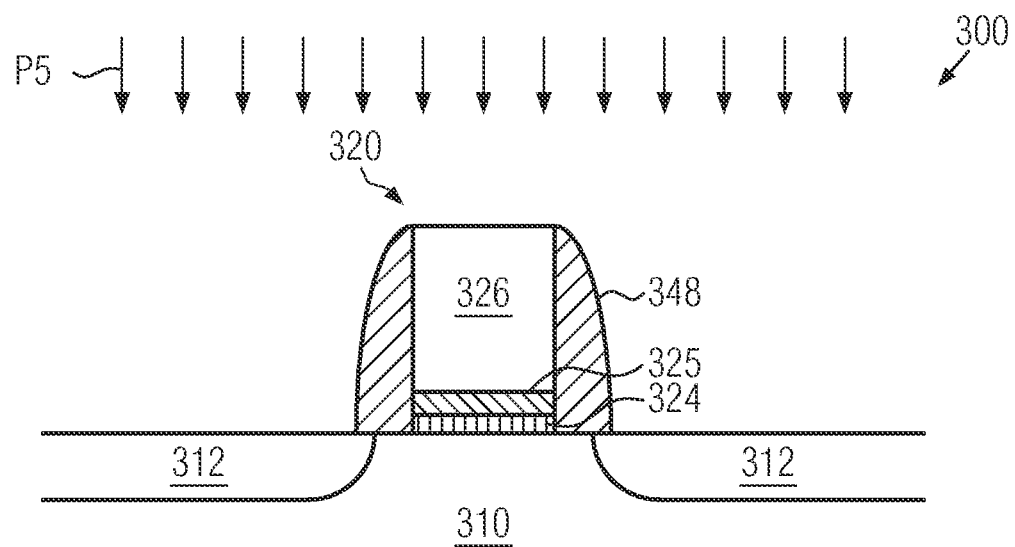
FIGS. 3a and 3b schematically show a process in accordance with some other illustrative embodiments of the present disclosure.

Alternative embodiments of the present disclosure will be described below with regard to FIGS. 3a and 3b. FIG. 3a shows schematically, in a cross-sectional view, a semiconductor device 300 formed in and above a semiconductor substrate 310. The semiconductor substrate 310 may be similar to the semiconductor substrate 210 as described above. The semiconductor device 300 comprises a gate structure 320 formed on a surface of the semiconductor substrate 310. The gate structure 320 has a gate insulating layer 324, a gate metal layer 325 and a gate electrode layer 326 provided in a gate stack configuration. Adjacent to the gate stack configuration, sidewall spacers 348 are formed adjacent to the gate stack covering sidewalls of the gate stack 324, 325 and 326. The person skilled in the art will appreciate that the gate stack configuration may correspond to gate stack configurations as described above with regard to FIG. 2a.

Source/drains regions 312 are formed within the semiconductor substrate 310 in alignment with the gate structure 320. The source/drain regions 312 may comprise source/drain extension regions and deep source/drain regions, although this is not explicitly illustrated in FIG. 3a.

Figure 3B:
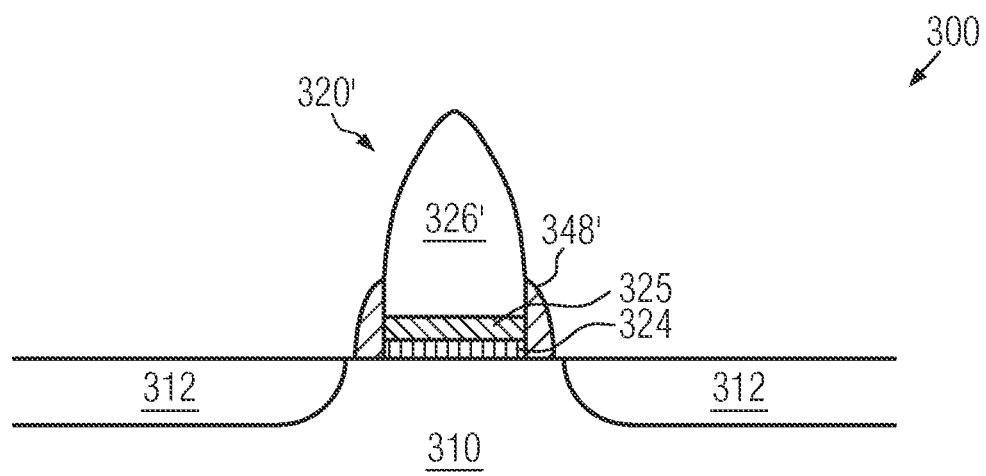

A trimming process P5 is applied to the semiconductor device 300 in order to obtain the semiconductor device 300 as depicted in FIG. 3b. When applying the trimming process P5, a trimmed gate structure 320' is formed. The trimmed gate structure 320' comprises a shaped gate electrode 326' and shaped sidewall spacers 348'. The shaped gate electrode layer 326' has a top part assuming the shape of a rounded tip. Accordingly, formation of silicide overhang in subsequent silicidation processes is suppressed, while the shaped sidewall spacers 348' allow for an optimal profile for subsequent ILD layers such that the formation of potential voids in ILD layers during subsequent processing is prevented and the advantages of spacer removal after silicidation are overcome. Furthermore, the shaped spacer structure, as provided by the sidewall spacer 348', ensures a reliable encapsulation of sensitive high-k materials in the gate dielectric layer 324. Furthermore, in shaping the gate electrode layer 326 and the sidewall spacer 348, resulting in the shaped gate structure 320' depicted in FIG. 3b, a good control of process margins for source/drain contacts and gate contacts are maintained, even for large-scale semiconductor devices and semiconductor device structures of high integration density.

According to some illustrative embodiments of the present disclosure, the etch process P5 may comprise a shaping of the top part of the gate electrode layer 326 comprising polysilicon, wherein the gate insulation layer 324 and the gate metal layer 325 are protected by the sidewall spacer 348. According to a special example herein, it is possible to incorporate anisotropic physical etch components, like Ar-ions, which are accelerated to the wafer surface, and then physically remove polysilicon at its top portion by momentum transfer from Ar-ions to polysilicon atoms in illustrative ion beam etch (IBE) processes.

The person skilled in the art will appreciate that according to the process illustrated in FIGS. 3a and 3b, overall boundary conditions for reducing a length dimension, i.e., a length of a gate electrode layer, may be obtained such that the reduced length of the gate electrode layer may still remain big enough so that contacts can land on silicide portions formed on gate electrode layers without decreasing contact CDs and negatively affecting contact resistances.

The person skilled in the art will appreciate that the application of the present disclosure may result in several advantages representing a huge benefit contributing to existing technology nodes at 32 nm and 28 nm.

The processes of the various illustrative embodiments of the present disclosure as described above overcome the problems discussed in the background of the invention. Some aspects of the present disclosure allow avoiding the formation of silicide overhang on top of gate electrodes. Herein, the described processes are designed for an easy integration in existing CMOS technologies. According to illustrative embodiments, a gate electrode shaping process is applied prior to silicidation. In some illustrative embodiments, the gate electrode shaping process may even be performed prior to the implantation of source/drain regions.

In accordance with some aspects of the present disclosure, the removal of sidewall spacers after silicidation is avoided because sidewall spacers are left partially intact in spacer shaper processes post S/D implant introduced in some aspects of the present disclosure, wherein the shaped spacers still define and limit salicide formation. In some illustrative embodiments of the present disclosure, spacer material may be selectively removed (e.g., silicon nitride spacer material) relative to other spacer material still protecting the substrate surface (e.g., silicon oxide liner material covering the substrate surface). At this point, the spacer can be tuned in its shape.

In some illustrative embodiments of the present disclosure, an additional etch step is added prior to the S/D anneal, or alternatively after the S/D anneal, in order to use the S/D anneal to change properties of nitride spacer material. This additional etch step may be used with or without the S/D implant masks, also reusing the selective masking of NMOS or PMOS device areas.

Accordingly, the disadvantages associated with conventional processings resulting in high silicon/silicide loss and the creation of disadvantageous profiles for subsequent ILD layers are overcome. According to some illustrative embodiments of the present disclosure, a spacer-shaping process after the implantation of source/drain regions and prior to silicidation is applied. In the shaping of the sidewall spacers, the sidewall spacers are left partially intact such that the partially-left sidewall spacers still reliably define limitations to silicide during silicidation. This process may be easily integrated into existing CMOS techniques because these spacer-shaping processes may be with or without source/drain implantation masks and may also reuse selective masking of NMOS or PMOS areas.

In summary, the present disclosure provides a method of forming a semiconductor device, comprising a shaping of a gate structure of the semiconductor device such that a spacer removal after silicide formation is avoided and silicide overhang is suppressed. In some aspects of the present disclosure, a method of forming a semiconductor device is provided, wherein a gate structure is provided over an active region of a semiconductor substrate, the gate structure comprising a gate electrode material and sidewall spacers. At least one of the gate electrode material and the sidewall spacers are shaped by applying a shaping process to the gate structure and a silicide portion is formed on the shaped gate structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, comprising:
   providing a gate structure over an active region of a semiconductor substrate, said gate structure comprising a gate electrode material and sidewall spacers formed on adjacent sides of said gate electrode material;
   applying a first shaping process to said sidewall spacers for reducing a height of sidewall spacers after source/drain regions are formed within said active region;
   performing a second shaping process after said first shaping process for selectively removing a portion of said gate electrode material relative to said shaped sidewall spacers, wherein, after said first and second shaping processes, at least a portion of said sidewall spacers remains on each side of said gate electrode material and upper and sidewall portions of said gate electrode material are exposed; and
   forming a silicide portion directly on said exposed upper and sidewall portions.

2. The method of claim 1, wherein said first and second shaping processes are applied to said sidewall spacers and said gate electrode material after source/drain regions are formed within said active region.

3. The method of claim 2, wherein said sidewall spacers comprise a first sidewall spacer and a second sidewall spacer formed on said first sidewall spacer, and wherein said first shaping process comprises selectively removing said first sidewall spacer relative to said second sidewall spacer and shaping said second sidewall spacer to reduce a height of the second sidewall spacer.

4. The method of claim 3, wherein said first shaping process further comprises performing an anisotropic etch process for shaping said second sidewall spacer after having removed said first sidewall spacer.

5. The method of claim 2, wherein said first shaping process comprises an implantation sequence into said sidewall spacers so as to form implantation regions within said sidewall spacers and a subsequent etching process for removing said implantation regions from said sidewall spacers so as to form shaped sidewall spacers.

6. The method of claim 5, wherein said implantation sequence comprises a first implantation step applied at a first tilt angle relative to a normal direction of a surface of said substrate and a second implantation step applied at a second tilt angle relative to a normal direction of said surface different from said first tilt angle, wherein each of said implantation steps comprises implanting at least one of xenon, germanium and the like.

7. The method of claim 1, wherein said gate electrode material comprises polysilicon and said shaping process comprises an IBE step involving Ar-ions for physically removing polysilicon at said upper surface.

8. The method of claim 1, wherein said sidewall spacers are trimmed back relative to said gate electrode material during said first shaping process.

9. The method of claim 1, wherein said shaped sidewall spacers are maintained at least until after FEOL processing is completed.

10. The method of claim 1, wherein said second shaping process comprises an RIE etch step.

11. A semiconductor device, comprising:
    a gate structure with sidewall spacers and a gate electrode material, wherein said sidewall spacers are disposed on each side of said gate electrode material and are of a substantially triangular shape, wherein sidewalls of said gate electrode material are only partially covered by said sidewall spacers;
    source/drain regions aligned to said gate structure; and
    a silicide region formed directly on upper and sidewall surfaces of said gate electrode material, wherein an overhang of said silicide region is substantially smaller than 1/6 of a separation between said source/drain regions by said gate electrode material.

12. A method of forming a semiconductor device, comprising:
    providing a gate structure over an active region of a semiconductor substrate, said gate structure comprising a gate electrode material and sidewall spacers formed on adjacent sides of said gate electrode material;
    applying a shaping process to said gate structure for reducing a height of at least one of said gate electrode material and said sidewall spacers, wherein said shaping process comprises an implantation sequence into said sidewall spacers so as to form implantation regions within said sidewall spacers and a subsequent etching process for removing said implantation regions from said sidewall spacers so as to form shaped sidewall spacers, and, after said shaping process, at least a portion of said sidewall spacers remains on each side of said gate electrode material and upper and sidewall portions of said gate electrode material are exposed; and forming a silicide portion directly on said exposed upper and sidewall portions.

13. The method of claim 12, wherein said shaping process is applied to said sidewall spacers after source/drain regions are formed within said active region.

14. The method of claim 12, wherein said sidewall spacers comprise a first sidewall spacer and a second sidewall spacer formed on said first sidewall spacer, and wherein said shaping process comprises selectively removing said first sidewall spacer relative to said second sidewall spacer and shaping said second sidewall spacer to reduce a height of said second sidewall spacer.

15. The method of claim 14, wherein said shaping process further comprises performing an anisotropic etch process for shaping said second sidewall spacer after having removed said first sidewall spacer.

16. The method of claim 12, wherein said implantation sequence comprises a first implantation step applied at a first tilt angle relative to a normal direction of a surface of said substrate and a second implantation step applied at a second tilt angle relative to a normal direction of said surface different from said first tilt angle, wherein each of said implantation steps comprises implanting at least one of xenon, germanium and the like.

17. The method of claim 12, wherein said shaping process comprises an RIE etch step for shaping said gate electrode material at said upper surface of said gate electrode material that is not covered by said sidewall spacers.

18. The method of claim 12, wherein said gate electrode material comprises polysilicon and said shaping process comprises an IBE step involving Ar-ions for physically removing polysilicon at said upper surface.

* * * * *